(12) United States Patent
Park

(10) Patent No.: US 8,278,159 B2
(45) Date of Patent: Oct. 2, 2012

(54) THIN FILM TRANSISTOR, METHOD OF FABRICATING THE SAME, AND A DISPLAY DEVICE INCLUDING THE THIN FILM TRANSISTOR

(75) Inventor: Byoung-Keon Park, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 295 days.

(21) Appl. No.: 12/820,860

(22) Filed: Jun. 22, 2010

(65) Prior Publication Data

US 2010/0255644 A1  Oct. 7, 2010

Related U.S. Application Data

(62) Division of application No. 11/510,052, filed on Aug. 24, 2006, now Pat. No. 7,763,889.

(30) Foreign Application Priority Data

Aug. 25, 2005 (KR) .......................... 10-2005-0078467

(51) Int. Cl.
  *H01L 21/00* (2006.01)
(52) U.S. Cl. .......................................... 438/149; 257/59
(58) Field of Classification Search .................... 257/59; 438/149
  See application file for complete search history.

(56) References Cited

U.S. PATENT DOCUMENTS

| 4,809,056 A | 2/1989 | Shirato et al. |
|---|---|---|
| 4,906,587 A | 3/1990 | Blake |
| 5,536,950 A | 7/1996 | Liu et al. |
| 5,821,562 A | 10/1998 | Makita et al. |
| 5,913,113 A | 6/1999 | Seo |
| 6,160,268 A | 12/2000 | Yamazaki |
| 6,166,786 A | 12/2000 | Ohkubo et al. |
| 6,653,700 B2 | 11/2003 | Chau et al. |
| 7,038,276 B2 | 5/2006 | Ker et al. |
| 7,064,388 B2 | 6/2006 | Hayakawa et al. |
| 7,276,730 B2 | 10/2007 | Yamazaki et al. |
| 2002/0066901 A1 | 6/2002 | Yamanaka et al. |
| 2002/0153569 A1 | 10/2002 | Katayama |

(Continued)

FOREIGN PATENT DOCUMENTS

EP  0 816 903 A1  1/1998

(Continued)

OTHER PUBLICATIONS

Machine Translation of KR 10-1996-0030429.

(Continued)

*Primary Examiner* — Anthony Ho
(74) *Attorney, Agent, or Firm* — Christie, Parker & Hale, LLP

(57) ABSTRACT

A thin film transistor (TFT), a method of fabricating the same, and a display device including the TFT, are provided. The method includes forming an edge region that is doped with impurities of a conductivity type opposite to a conductivity type of impurities doped into source and drain regions. The edge region is in contact with a channel region and an edge portion of the source region. The method also includes forming contact holes for source and drain electrodes to expose a portion of the drain region and expose respective portions of the source region and the edge region contacting the edge portion of the source region; and forming source and drain electrodes. Thus, a source-body contact is automatically formed so that an edge effect can be reduced and a kink effect can be reduced or removed.

6 Claims, 9 Drawing Sheets

U.S. PATENT DOCUMENTS

2004/0206956 A1 10/2004 Yanai et al.

FOREIGN PATENT DOCUMENTS

| | | |
|---|---|---|
| JP | 11-54759 | 2/1999 |
| JP | 2003-7719 | 1/2003 |
| JP | 2003-152184 | 5/2003 |
| JP | 2003-174172 | 6/2003 |
| KR | 1996-0030429 | 8/1996 |
| KR | 10-2003-0003043 A | 1/2003 |
| KR | 10-2003-0069852 A | 8/2003 |
| KR | 10-2004-0092916 | 11/2004 |
| KR | 10-2005-0018530 | 2/2005 |

OTHER PUBLICATIONS

Machine Translation of JP 2003-174172.
English abstract for Publication No. 10-1996-0030429, dated Aug. 17, 1996, in the name of Samsung Electronics Co., Ltd.
Korean Notice of Allowance dated Oct. 13, 2008, for corresponding Korean Patent application 10-2007-0023628.
Korean Patent Abstracts, Publication No. 10-2003-0003043, dated Jan. 9, 2003, in the name of Naoki Makita et al.
Korean Patent Abstracts, Publication No. 10-2003-0069852, dated Aug. 27, 2003, in the name of Misako Nakazawa et al.
European Search Report dated Aug. 21, 2007, for EP 04090350.2, in the name of Samsung SDI Co., Ltd.
U.S. Office action dated Dec. 19, 2007, for related U.S. Appl. No. 10/938,000, indicating relevance of listed U.S. references 7,038,276, 7,064,388, and 7,276,730.
Patent Abstracts of Japan, Publication No. 11-054759, dated Feb. 26, 1999, in the name of Takashi Yamada et al.
Patent Abstracts of Japan, Publication No. 2003-007719, dated Jan. 10, 2003, in the name of Kazuki Kitamura et al.
Patent Abstracts of Japan, Publication No. 2003-152184, dated May 23, 2003, in the name of Yutaka Hayashi et al.
Patent Abstracts of Japan, Publication No. 2003-174172, dated Jun. 20, 2003, in the name of Takashi Yamada et al.
Korean Patent Abstracts, Publication No. 1020050018530, dated Feb. 23, 2005 in the name of Byoung Deog Choi et al.
Korean Patent Abstracts, Publication No. 1020040092916, dated Nov. 4, 2004 in the name of Seong Sik Bae et al.
Office action dated Jan. 28, 2009 for related U.S. Appl. No. 11/760,869 listing cited references US 4,809,056; US 4,906,587 and US 5,913,113. KR 10-2003-0003043 and KR 10-2003-0069852 dated Jan. 15, 2009.
Office action dated Jan. 28, 2009 for related U.S. Appl. No. 11/760,876 listing cited references US 4,809,056; US 4,906,587 and US 6,653,700. KR 10-2003-0003043 and KR 10-2003-0069852 dated Jan. 15, 2009.
Office action dated Feb. 10, 2009 for related U.S. Appl. No. 11/760,864 listing cited references US 4,809,056; US 6,653,700; US 5,536,950 and US 6,160,268 B2. KR 10-2003-0003043 and KR 10-2003-0069852 dated Jan. 15, 2009.
Chinese Reexamination dated Mar. 12, 2009, for Chinese application 200410042055.5, with English translation, noting listed U.S. Patent 4,809,056.

THIN FILM TRANSISTOR, METHOD OF FABRICATING THE SAME, AND A DISPLAY DEVICE INCLUDING THE THIN FILM TRANSISTOR

CROSS-REFERENCE TO RELATED APPLICATION

This application is a divisional of U.S. patent application Ser. No. 11/510,052, filed Aug. 24, 2006, which claims priority to and the benefit of Korean Patent Application No. 10-2005-0078467, filed Aug. 25, 2005, the entire content of both of which is incorporated herein by reference.

BACKGROUND OF THE INVENTION

1. Field of the Invention

The present invention relates to a thin film transistor (TFT), a method of fabricating the same, and a display device including the TFT, and more particularly, to a TFT and a method of fabricating the same, which can reduce an edge effect and/or a kink effect.

2. Description of Related Art

An organic light emitting diode (OLED) display device is an emissive device with excellent viewing angle and contrast. Since a separate light source such as a backlight is not required unlike liquid crystal displays (LCDs), the OLED display device may be made lightweight and thin, and consumes less power than conventional cathode ray tube (CRT) display devices.

Furthermore, the OLED display device can be driven with direct current at a low voltage and has a fast response speed. Also, since the OLED display device is fabricated using only solid materials, it is highly resistant to external shock, can be used in an environment having a wide range of temperatures, and is simple and inexpensive to manufacture.

Some flat panel displays (FPDs), such as an OLED display device or an LCD, employ thin film transistors (TFTs) as switching devices and/or driving devices.

FIG. 1A is a cross-sectional view of a conventional TFT, and FIG. 1B is a plan view of the TFT depicted in FIG. 1A. The cross-section of FIG. 1A is taken along the line I-I of FIG. 1B.

Referring to FIGS. 1A and 1B, a buffer layer 101 is disposed on a substrate 100 such as a glass substrate or a plastic substrate, and a first semiconductor layer 102 and a second semiconductor layer 103 are disposed on the buffer layer 101. The first semiconductor layer 102 includes source and drain regions 102a, which are doped with P-type impurities, and a channel region 102b, which is interposed between the source and drain regions 102a. Also, the second semiconductor layer 103 includes source and drain regions 103a, which are doped with N-type impurities, and a channel region 103b, which is interposed between the source and drain regions 103a. The second semiconductor layer 103 also includes lightly doped drain (LDD) regions 103c, which are respectively interposed between the source and drain regions 103a and the channel region 103b.

A gate insulating layer 104 is disposed on the first semiconductor layer 102 and the second semiconductor layer 103, and gate electrodes 105 and 106 are disposed on the gate insulating layer 104 at positions corresponding to the channel regions 102b and 103b of the first and second semiconductor layers 102 and 103, respectively. Also, an interlayer insulating layer 107 is disposed to protect the gate electrodes 105 and 106.

Further, contact holes 108 are formed to expose predetermined regions of the source and drain regions 102a and 103a of the first and second semiconductor layers 102 and 103, and source and drain electrodes 109 and 110 are disposed on the interlayer insulating layer 107 to fill the contact holes 108.

In this case, a TFT including the first semiconductor layer 102 is a P-type TFT, and a TFT including the second semiconductor layer 103 is an N-type TFT. Each of the P- and N-type TFTs may be used' as a switching device or a driving device of the FPD such as an LCD or an OLED display device. However, the conventional P- and N-type TFTs do not effectively remove an edge effect, a kink effect, and other factors such as bipolar junction transistors (BJTs) that deteriorate the characteristics of the TFTs.

SUMMARY OF THE INVENTION

An exemplary embodiment of the present invention provides a thin film transistor (TFT), which includes an edge region doped with impurities of a conductivity type opposite to a conductivity type of impurities doped into source and drain regions, and an interconnection portion contacting the edge region and the source region, and method of fabricating the same. One exemplary embodiment is directed to a display device including the TFT.

In an exemplary embodiment according to the present invention, a TFT includes: a substrate; a semiconductor layer disposed on the substrate and including a source region, a drain region, a channel region interposed between the source region and the drain region, and an edge region connected to the channel region and the source region; and an interconnection portion disposed on the semiconductor layer and electrically connecting the source region and the edge region.

In another exemplary embodiment according to the present invention, a TFT includes: a substrate; a first semiconductor layer disposed on the substrate and including a first source region, a first drain region, a first channel region interposed between the first source region and the first drain region, and an edge region connected to the first channel region and the first source region; a second semiconductor layer disposed on the substrate and including a second source region, a second drain region, a second channel region interposed between the second source region and the second drain region, and lightly doped drain (LDD) regions respectively interposed between the second source region and the second channel region and between the second drain region and the second channel region; a gate insulating layer disposed on the first and second semiconductor layers; a first gate electrode and a second gate electrode disposed on the gate insulating layer at positions corresponding to the first and second channel regions, respectively; an interlayer insulating layer disposed on the first and second gate electrodes; and an interconnection portion disposed on the interlayer insulating layer and electrically connecting the first source region and the edge region.

In still another exemplary embodiment according to the present invention, a method of fabricating a TFT includes: placing a semiconductor layer having an edge portion on a substrate; placing a gate insulating layer on the substrate having the semiconductor layer; forming a first pattern on the gate insulating layer to expose the edge portion of the semiconductor layer; performing a first impurity implantation process on the edge portion of the semiconductor layer using the first pattern as a mask to form an edge region; removing the first pattern and placing a gate electrode on the gate insulating layer; forming a second pattern on the substrate to cover at least the edge region; performing a second impurity implantation process on the semiconductor layer using the second pattern as a mask to form source and drain regions on respective sides of a channel region in the semiconductor layer; removing the second pattern and placing an interlayer insulating layer on the substrate having the gate electrode; etching the gate insulating layer and the interlayer insulating layer to form a contact hole exposing a portion of the source region and a portion of the edge region; and placing a conductive layer on the substrate and then patterning the conductive layer to form an interconnection portion that connects the exposed portion of the edge region and the exposed portion of the source region.

In yet another exemplary embodiment according to the present invention, a method of fabricating a TFT includes: placing a first semiconductor layer having a first source region, a first drain region, a first channel region, and an edge region and a second semiconductor layer having a second source region, a second drain region, a second channel region, and LDD regions on a substrate; placing a gate insulating layer on the substrate having the first and second semiconductor layers; forming a first pattern on the gate insulating layer to expose the edge region of the first semiconductor layer and the second source and drain regions of the second semiconductor layer; performing a first impurity implantation process on the edge region of the first semiconductor layer and the second source and drain regions of the second semiconductor layer using the first pattern as a mask; removing the first pattern and forming a first gate electrode and a second gate electrode on the first and second semiconductor layers, respectively; performing an LDD implantation process on the LDD regions of the second semiconductor layer using the second gate electrode as a mask; forming a second pattern on the substrate to cover at least the edge region of the first semiconductor layer and the second semiconductor layer; performing a second impurity implantation process on the first source and drain regions of the first semiconductor layer using the second pattern as a mask; placing an interlayer insulating layer on the substrate having the first and second gate electrodes; forming a contact hole to expose a portion of the first source region of the first semiconductor layer and a portion of the edge region of the first semiconductor layer; and placing a conductive layer on the substrate and then patterning the conductive layer to form an interconnection portion that electrically connects the exposed portion of the edge region of the first semiconductor layer and the exposed portion of the first source region of the first semiconductor layer.

In yet another exemplary embodiment according to the present invention, a display device includes: a substrate; and a plurality of pixels disposed on the substrate. At least one of the pixels includes a thin film transistor (TFT) including: a semiconductor layer disposed on the substrate and including a source region, a drain region, a channel region interposed between the source region and the drain region, and an edge region connected to the channel region and the source region; and an interconnection portion disposed on the semiconductor layer and electrically connecting the source region and the edge region.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1A:
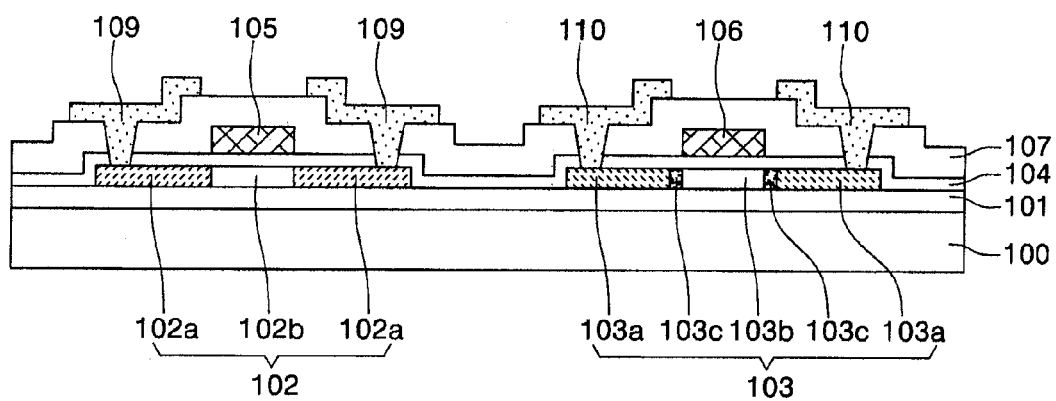
FIG. 1A is a cross-sectional view of a conventional thin film transistor (TFT)
Figure 1B:
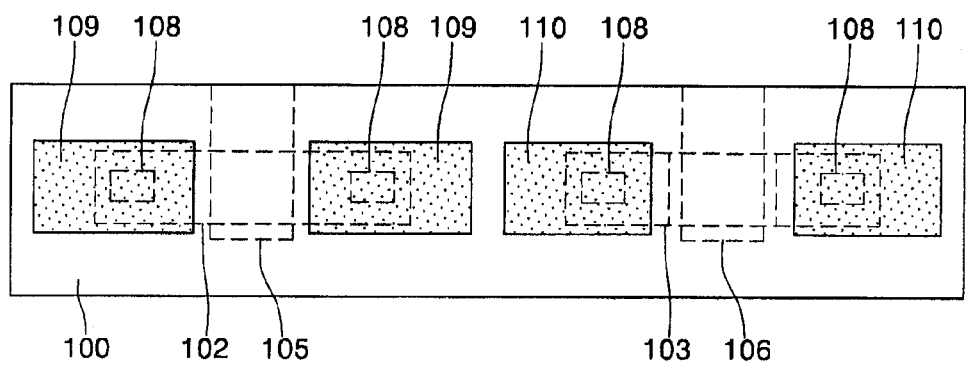
FIG. 1B is a plan view of the TFT depicted in FIG. 1A.

The present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements.

Figure 2A:
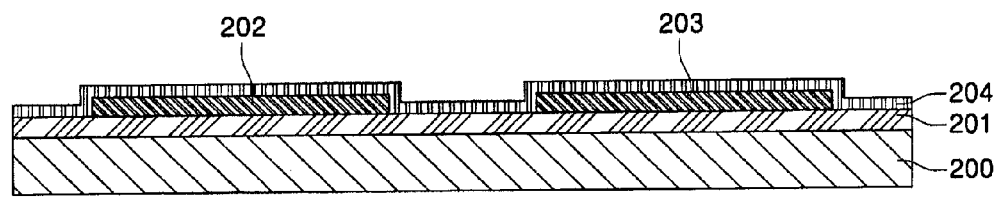
FIGS. 2A, 3A, 4A, 5A, 6A, and 7A are cross-sectional views illustrating a method of fabricating a TFT according to an exemplary embodiment of the present invention.
Figure 2B:
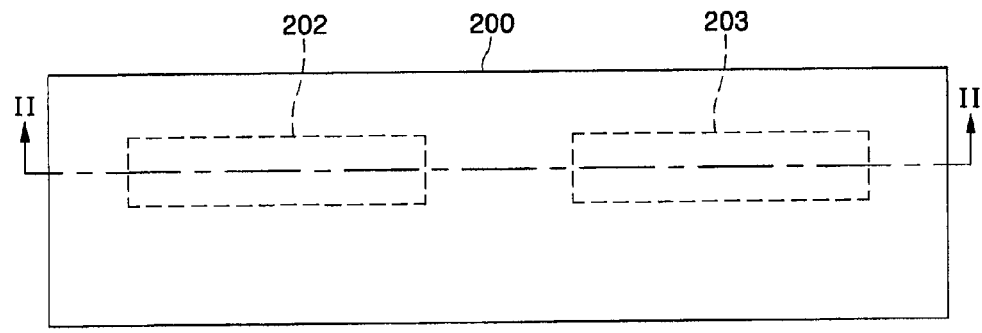
FIGS. 2B, 3B, 4B, 5B, 6B, and 7B are plan views of the TFT fabricating stages depicted in FIGS. 2A, 3A, 4A, 5A, 6A, and 7A, respectively.

FIG. 2A is a cross-sectional view illustrating a method of fabricating a TFT according to an exemplary embodiment of the present invention, and FIG. 2B is a plan view of the partially fabricated TFT depicted in FIG. 2A. The cross-section of FIG. 2A is taken along the line II-II of FIG. 2B.

Referring to FIGS. 2A and 2B, a buffer layer 201 is formed on a substrate 200, such as a glass substrate or a plastic substrate. The buffer layer 201 prevents moisture or impurities generated on the substrate from diffusing into an element to be formed later and to regulate a heat transmission rate during crystallization, thereby enabling a semiconductor layer to be smoothly crystallized.

Thereafter, a first semiconductor layer 202 and a second semiconductor layer 203 are formed on the buffer layer 201. In this case, the first and second semiconductor layers 202 and 203 may be polycrystalline silicon (poly-Si) layers, which are formed by a crystallization process, such as a rapid thermal annealing (RTA) process, a solid phase crystallization (SPC) process, an excimer laser crystallization (ELA) process, a metal induced crystallization (MIC) process, a metal induced lateral crystallization (MILC) process, or a sequential lateral solidification (SLS) process. Also, when the first and second semiconductor layers 202 and 203 are formed on the substrate 200, they may be silicon layers, which are doped with P- or N-type impurities.

The first semiconductor layer 202 shown in FIG. 2B is formed to have first source and drain regions, a first channel region, and an edge region, and the second semiconductor layer 203, also shown in FIG. 2B, is formed to have second source and drain regions, a second channel region, and LDD regions. The first source and drain regions, the first channel region, the edge region, the second source and drain regions, the second channel region, and the LDD regions will be described in detail later.

Thereafter, a gate insulating layer 204 is formed on the substrate 200 having the first semiconductor layer 202 and the second semiconductor layer 203. The gate insulating layer 204 may be an oxide layer, a nitride layer, or a composite layer of the oxide and nitride layers.

Figure 3A:
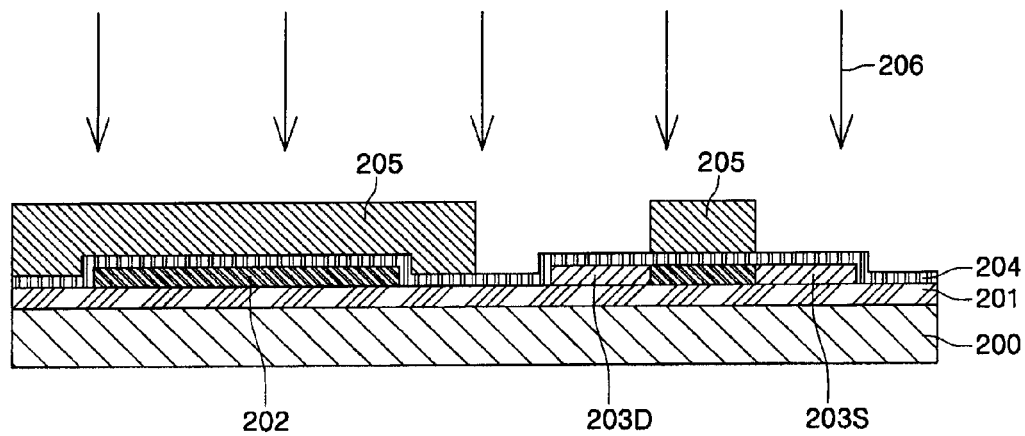
Figure 3B:
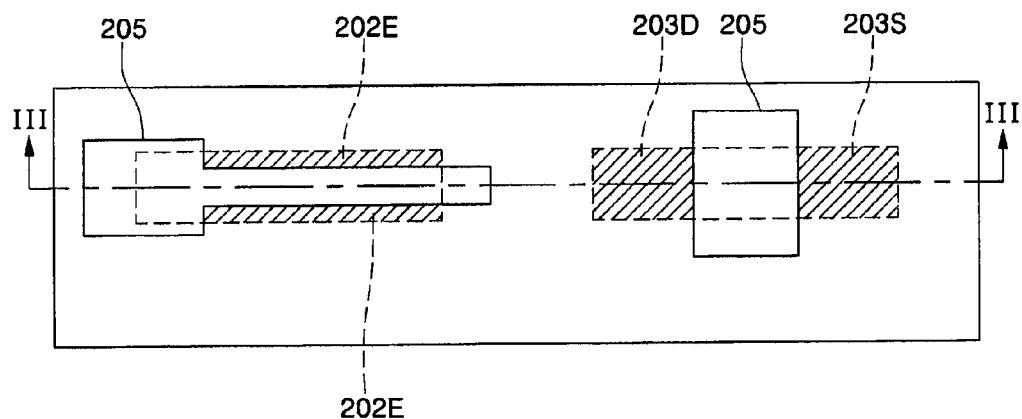

FIG. 3A is a cross-sectional view illustrating a method of fabricating a TFT according to an exemplary embodiment of the present invention, and FIG. 3B is a plan view of the partially fabricated TFT depicted in FIG. 3A. The cross-section of FIG. 3A is taken along the line of FIG. 3B.

Referring to FIGS. 3A and 3B, photoresist is coated on the substrate 200 having the gate insulating layer 204 and exposed to light, thereby forming a first pattern 205 to expose an edge region 202E of the first semiconductor layer 202 and expose second source and drain regions 203S and 203D of the second semiconductor layer 203.

In this case, a portion of the first pattern 205, which is formed on the first semiconductor layer 202, should cover a region where a first channel region and first source and drain regions of the first semiconductor layer 202 will be formed, and another portion of the first pattern 205, which is formed on the second semiconductor layer 203, should cover a region where a second channel and LDD regions of the second semiconductor layer 203 will be formed.

Thereafter, a first impurity implantation process 206 is performed using the first pattern 205 as a mask so that impurities are heavily doped into the edge region 202E of the first semiconductor layer 202 and the second source and drain regions 203S and 203D of the second semiconductor layer 203.

The impurities used in the first impurity implantation process 206 have a conductivity type opposite to a conductivity type of impurities to be doped into source and drain regions of the first semiconductor layer 202, which will be formed later. That is, when P-type impurities are to be doped into the source and drain regions of the first semiconductor layer 202, N-type impurities are used in the first impurity implantation process 206, and when N-type impurities are to be doped into the source and drain regions of the first semiconductor layer 202, P-type impurities are used in the first impurity implantation process 206.

Conventionally, when the first semiconductor layer 202 is formed, an edge portion of the first semiconductor layer 202 may be damaged and have nonuniform characteristics. For example, the formation of the first semiconductor layer 202 typically includes forming a silicon layer on the entire surface of the substrate 200, forming a photoresist pattern on the silicon layer, and etching the silicon layer using the photoresist pattern as a mask. Here, when the silicon layer is etched, the edge portion of the first semiconductor layer 202 may be damaged by an etchant or plasma used during the etching process and have nonuniform or degraded semiconductor characteristics due to the remaining photoresist. As a result, a conventional TFT including the first semiconductor layer 202 may undergo changes in some characteristics, such as a threshold voltage or an S-factor, and a hump may occur in an I-V curve that exhibits the characteristic of the TFT. These problems may be caused because the damaged edge portion is also used as a channel for a current flow. In order to solve these problems, in one embodiment of the present invention, the edge portion (especially the edge portion adjacent to the channel region) is converted into an edge region 202E by doping the edge portion with impurities that are different from the impurities used to dope the channel region and the source and drains regions, such that the current flows only through the channel region.

Figure 4A:
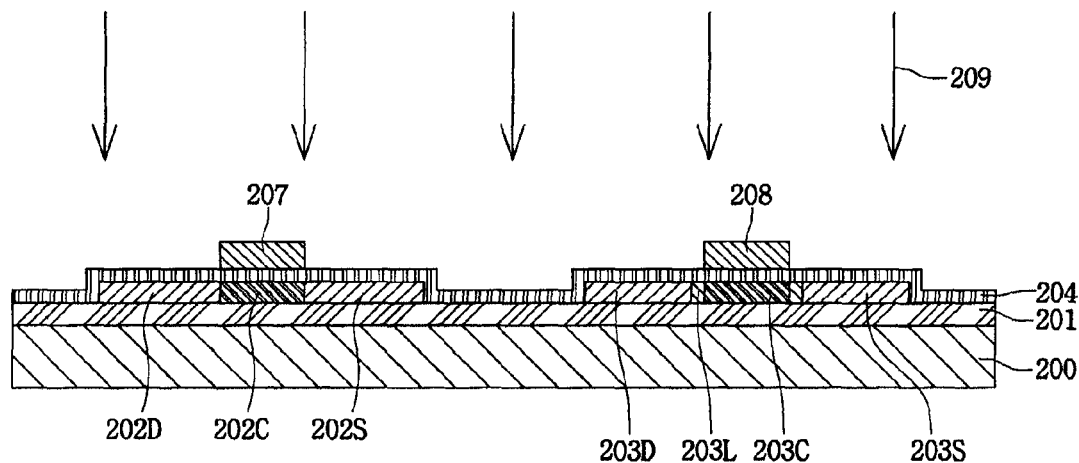
Figure 4B:
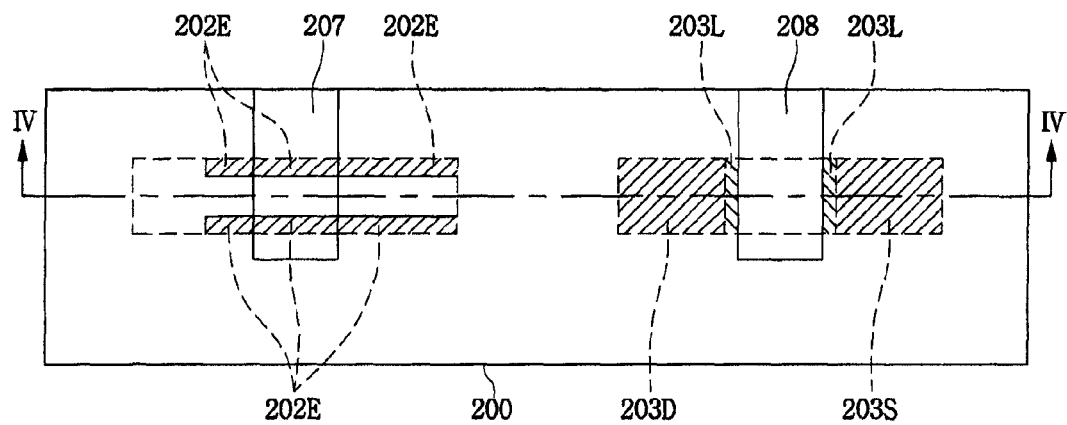

FIG. 4A is a cross-sectional view illustrating a method of fabricating a TFT according to an exemplary embodiment of the present invention, and FIG. 4B is a plan view of the partially fabricated TFT depicted in FIG. 4A. The cross-section of FIG. 4A is taken along the line IV-IV of FIG. 4B.

Referring to FIGS. 4A and 4B, the first pattern 205 of FIG. 3A is removed, and a first gate electrode 207 and a second gate electrode 208 are formed on the gate insulating layer 204 at positions corresponding to the first and second semiconductor layers 202 and 203, respectively.

Since the first gate electrode 207 is formed at the position corresponding to the first semiconductor layer 202, a first channel region 202C and first source and drain regions 202S and 202D are defined in the first semiconductor layer 202, and since the second gate electrode 208 is formed at the position corresponding to the second semiconductor layer 203, a second channel region 203C and the second source and drain regions 203S and 203D are defined in the second semiconductor layer 203. Also, the width of the second gate electrode 208 is smaller than that of a portion of the first pattern 205 formed on the second semiconductor layer 203 so that LDD regions 203L are defined.

Thereafter, an LDD implantation process 209 is performed on the substrate 200 using the first and second gate electrodes 207 and 208 as masks.

During the LDD implantation process 209, the same impurities are implanted as in the first impurity implantation process 206 at a lower concentration than in the first impurity implantation process 206. This is because the impurities should be implanted into the LDD regions 203L of the second semiconductor layer 203 at a lower concentration than the second source and drain regions 203S and 203D of the second semiconductor layer 203.

Figure 5A:
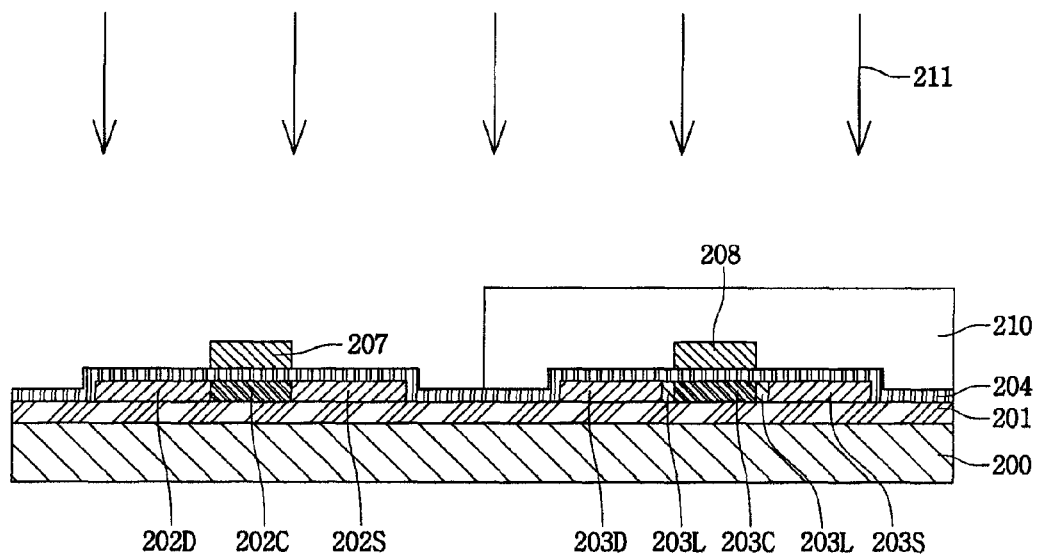
Figure 5B:
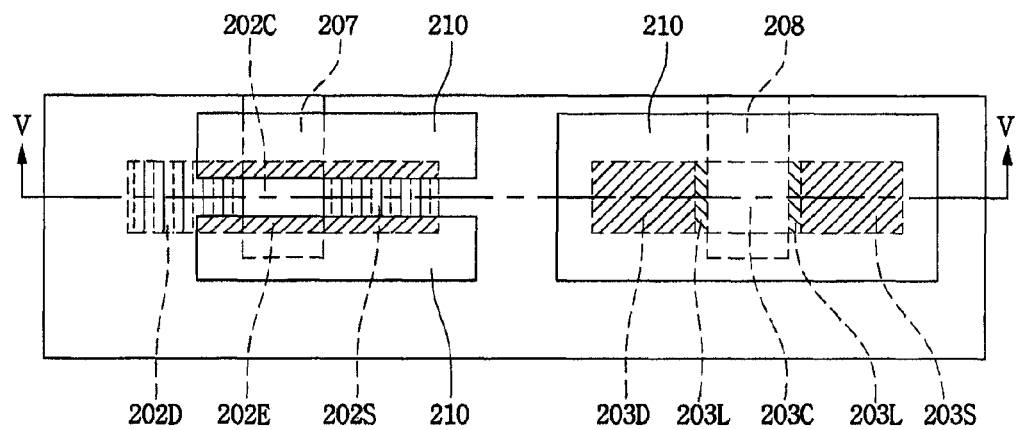

FIG. 5A is a cross-sectional view illustrating a method of fabricating a TFT according to an exemplary embodiment of the present invention, and FIG. 5B is a plan view of the partially fabricated TFT depicted in FIG. 5A. The cross-section of FIG. 5A is taken along the line V-V of FIG. 5B.

Referring to FIGS. 5A and 5B, photoresist is coated on the substrate 200 having the first and second gate electrodes 207 and 208 and exposed to light, thereby forming a second pattern 210 to completely cover at least the edge region 202E of the first semiconductor layer 202 and completely cover the second semiconductor layer 203. Although it is illustrated in FIG. 5B that the edge region 202E and the second semiconductor layer 203 are entirely covered with the second pattern 210, the second pattern 210 may further cover the first gate electrode 207.

Thereafter, a second impurity implantation process 211 is performed on the first source and drain regions 202S and 202D of the first semiconductor layer 202 using the second pattern 210 as a mask. In this case, it can be seen that the first source region 202S is formed in the already formed edge region 202E. Here, at least one side surface of the first source region 202S is formed to contact the edge region 202E.

Accordingly, after the first impurity implantation process 206, the LDD implantation process 209, and the second impurity implantation process 211, impurities of the same conductivity type are implanted into the edge region 202E of the first semiconductor layer 202 and the second source and drain regions 203S and 203D and the LDD regions 203L of the second semiconductor layer 203. However, the impurities are implanted at respectively different concentrations during the first impurity implantation process 206, the LDD implantation process 209, and the second impurity implantation process 211. That is, the impurities are implanted into the LDD regions 203L at a lower concentration than the other regions.

Figure 6A:
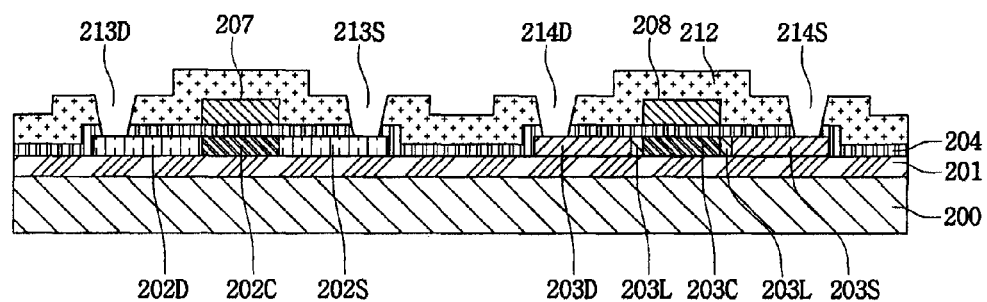
Figure 6B:
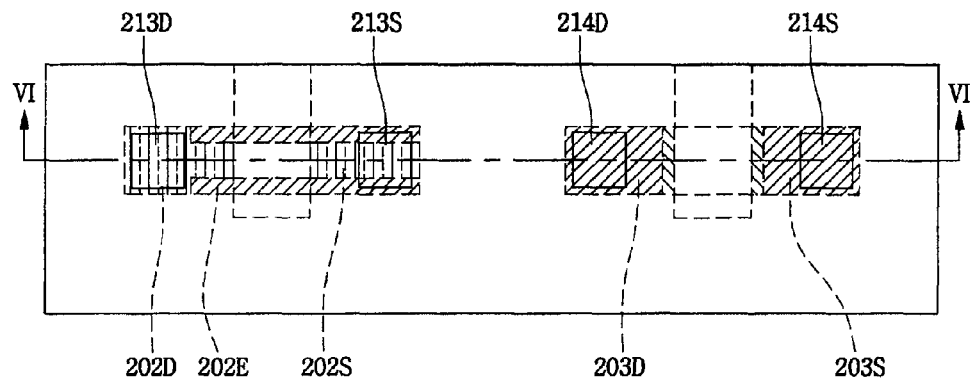

FIG. 6A is a cross-sectional view illustrating a method of fabricating a TFT according to an exemplary embodiment of the present invention, and FIG. 6B is a plan view of the partially fabricated TFT depicted in FIG. 6A. The cross-section of FIG. 6A is taken along the line VI-VI of FIG. 6B.

Referring to FIGS. 6A and 6B, the second pattern 210 is removed, and an interlayer insulating layer 212 is formed on the substrate 200 having the first and second gate electrodes 207 and 208.

Thereafter, the interlayer insulating layer 212 and the gate insulating layer 204 are etched, thereby forming contact holes 213D, 213S, 214S and 214D. Thus, the contact holes 213S and 213D respectively expose predetermined regions of the first source and drain regions 202S and 202D of the first semiconductor layer 202 and a predetermined region of the edge region 202E contacting the first source region 202S, and the contact holes 214S and 214D respectively expose predetermined regions of the second source and drain regions 203S and 203D of the second semiconductor layer 203.

Figure 7A:
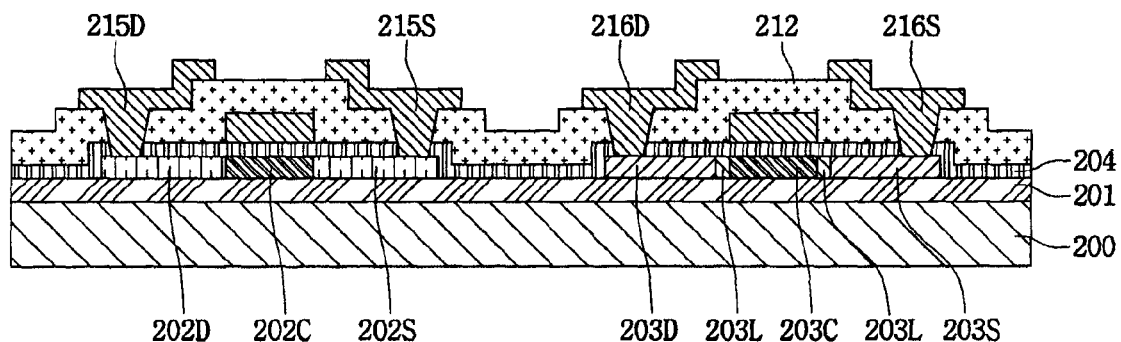
Figure 7B:
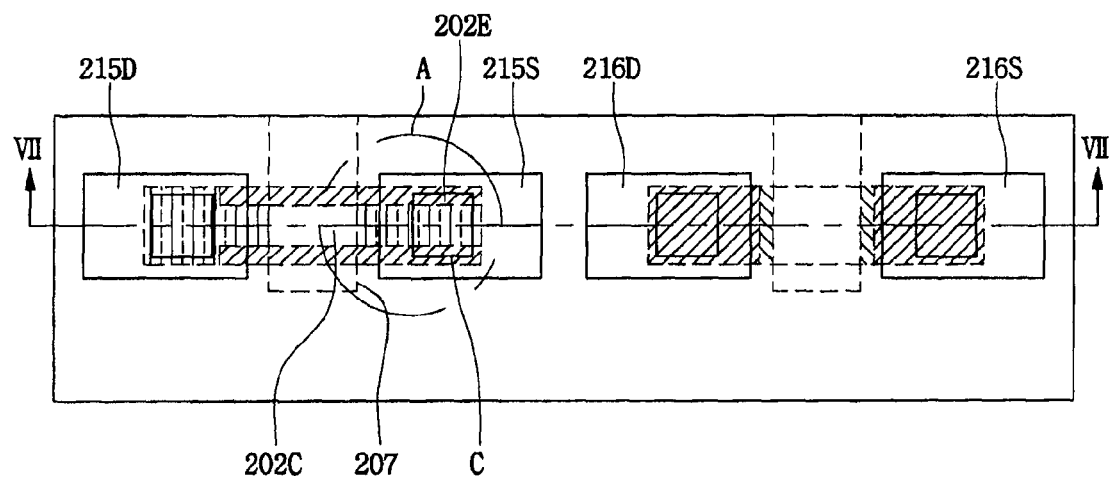

FIG. 7A is a cross-sectional view illustrating a method of fabricating a TFT according to an exemplary embodiment of the present invention, and FIG. 7B is a plan view of the TFT depicted in FIG. 7A. The cross-section of FIG. 7A is taken along the line VII-VII of FIG. 7B.

Referring to FIGS. 7A and 7B, a conductive layer is formed on the substrate 200 having the contact holes 213S, 213D, 214S and 214D that are formed by etching the interlayer insulating layer 212 and the gate insulating layer 204. After that, the conductive layer is patterned, thereby forming first source and drain electrodes 215S and 215D and second source and drain electrodes 216S and 216D. The first source electrode 215S includes an interconnection portion that electrically connects the first channel region 202C of the first semiconductor layer 202 corresponding to the first gate electrode 207 with the first source region 202S by electrically connecting the first source region 202S of the first semiconductor layer 202 with the edge region 202E of the first semiconductor layer 202. The first drain electrode 215D is in contact with the first drain region 202D of the first semiconductor layer 202. Also, the second source and drain electrodes 216S and 216D are in contact with the second source and drain regions 203S and 203D of the second semiconductor layer 203, respectively.

Figure 8:
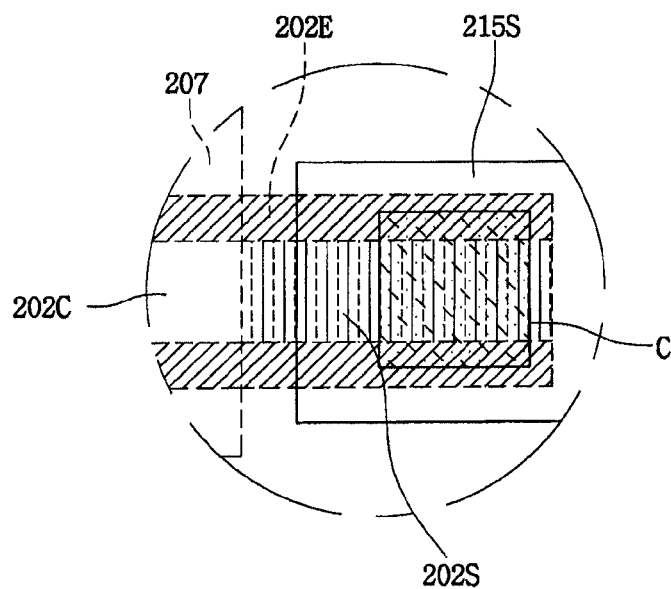
FIG. 8 is a magnified plan view of a region "A" of FIG. 7B.

FIG. 8 is a magnified plan view of a region "A" of FIG. 7B.

Referring to FIG. 8, a conductive layer is deposited on the substrate 200 having the contact hole 213S (shown in FIG. 6A) that exposes a predetermined region of the first source region 202S of the first semiconductor layer 202 and a predetermined region of the edge region 202E at the same time and then patterned, thereby forming the first source electrode 215S. Here, since a contact region C includes a predetermined region of the first source region 202S and a predetermined region of the edge region 202E, the interconnection portion that electrically connects the first source region 202S and the edge region 202E can be formed as a portion of the first source electrode 215S. In this case, the edge region 202E is also connected to the first channel region 202C of the first semiconductor layer 202 so that the interconnection portion substantially electrically connects the first channel region 202C to the source region 202S.

With an improvement in the resolution of FPDs and the downscaling of TFTs, hot carriers are generated in a drain region adjacent to a channel region at a low drain voltage owing to a lateral electric field (LEF) of the drain region. Thus, impact ionization is caused by the hot carriers, and a lot of electron-hole pairs are produced, so that continuous movement of the carriers to the channel region, i.e., avalanche multiplication, occurs. This avalanche multiplication leads to a sudden increase in a drain current caused by a kink effect, a change in a threshold voltage, and deterioration of the TFTs.

The above-described problems, which are regarded as bipolar junction transistor (BJT) effects, can be solved by forming an interconnection portion that electrically connects the first channel region 202C and the first source region 202S through the edge region 202E of the first semiconductor layer 202 as in the described embodiment of the present invention.

In other words, the electron-hole pairs, which are generated in the first channel region 202C and the first drain region 202D owing to the LEF, move to the first source region 202S through the edge region 202E and the interconnection portion so that the first drain region 202D can be freed from the BJT effects.

Figure 9:
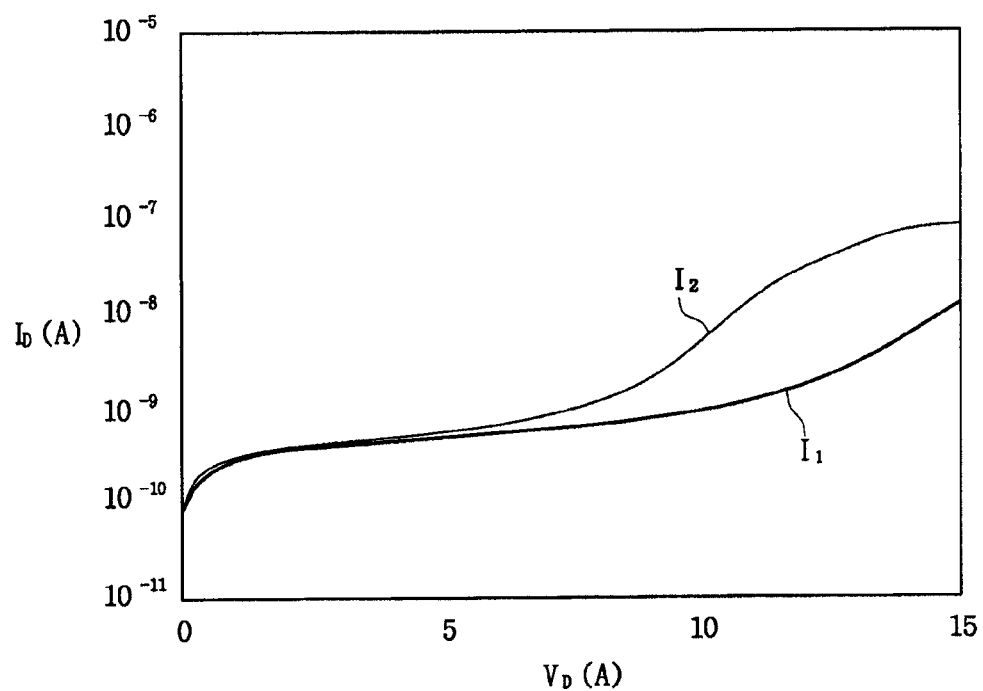
FIG. 9 is a graph showing the characteristics of a TFT fabricated according to an exemplary embodiment of the present invention.

FIG. 9 is a graph showing the characteristics of a TFT fabricated according to an exemplary embodiment of the present invention.

Referring to FIG. 9, it can be seen that a drain current $I_D$ ($I_1$) of the TFT including the interconnection portion that electrically connects the first channel region 202C with the first source region 202S is less affected by the kink effect at a high drain voltage $V_D$ than a drain current $I_2$ of a conventional TFT, such that a breakdown due to the kink effect does not occur, thereby exhibiting excellent drain current characteristics. In other words, by electrically connecting the first channel region 202C and the first source region 202S through the interconnection portion, a parasitic BJT is removed from the TFT so that the kink effect can be greatly weakened.

In this case, FIG. 9 shows the measurements of a current supplied to the channel region 202C (i.e., the drain current $I_D$) when a gate voltage $V_G$ of 0.5 V is applied to the first gate electrode 207 and a drain voltage $V_D$ applied to the drain electrode 215D is varied.

According to one embodiment of the present invention as described above, a TFT and a method of fabricating the same reduce an edge effect and reduce or remove a kink effect so that a large channel current and a low sub-threshold voltage swing can be obtained at a low gate voltage.

Figure 10:
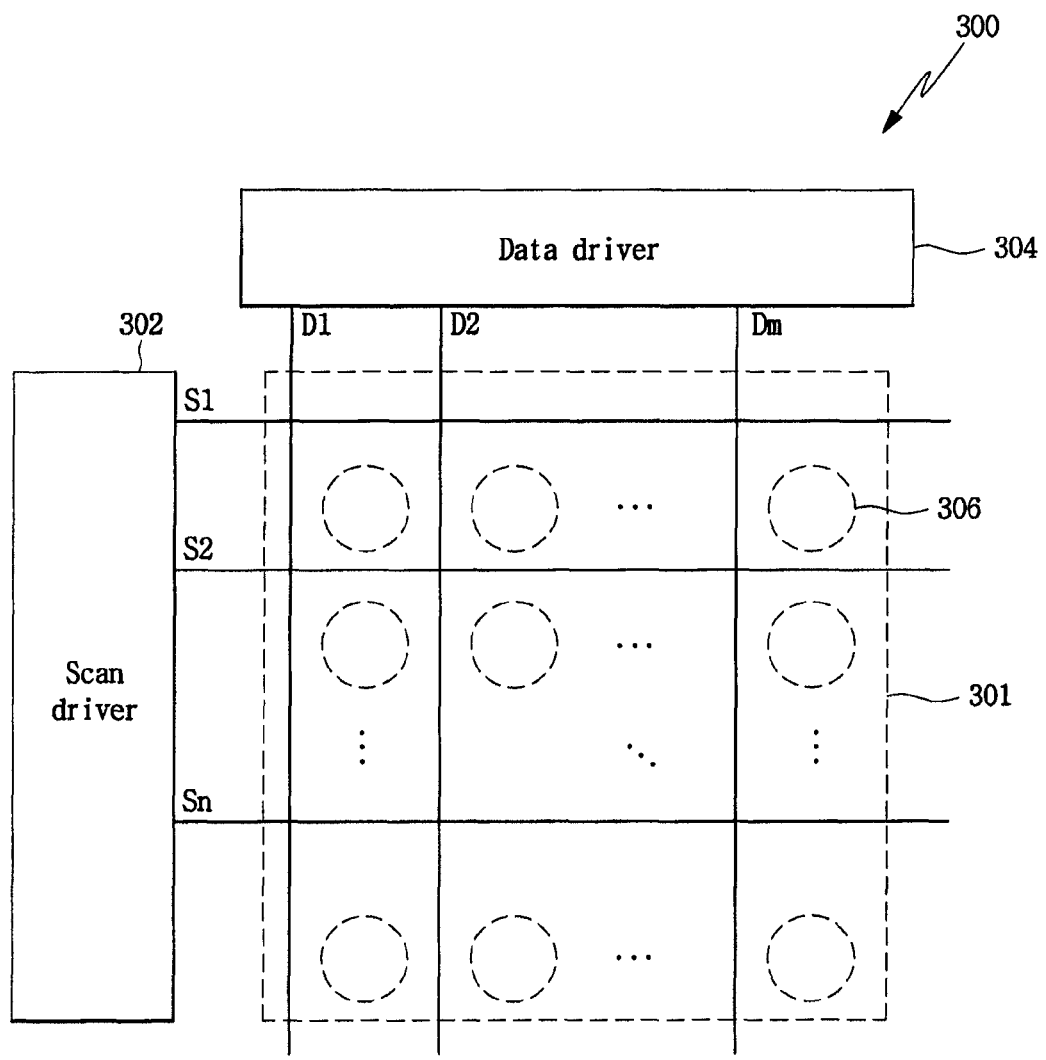
FIG. 10 is a schematic diagram of a display device having a TFT fabricated in accordance with an exemplary embodiment of the present invention.

FIG. 10 is a schematic diagram of a display device 300 having TFTs fabricated in accordance with an exemplary embodiment of the present invention. As can be seen in FIG. 10, the display device 300 includes a plurality of pixels 306 coupled to scan lines S1 to Sn and data lines D1 to Dm, in a display area 301. A scan driver 302 provides scan signals to the scan lines, and a data driver 304 provides data signals to the data lines. Each pixel includes at least one TFT (e.g., a driving TFT and/or a switching TFT) fabricated in accordance with the described embodiment of the present invention, as shown in FIGS. 7A and 7B, for example.

While exemplary embodiments of the present invention have been described herein, it will be apparent to those of ordinary skill in the art that various modifications in form and detail can be made to the described embodiments without departing from the spirit and scope of the present invention as defined by the appended claims and their equivalents.

What is claimed is:

1. A method of fabricating a thin film transistor (TFT), comprising:
   placing a semiconductor layer having an edge portion on a substrate;
   placing a gate insulating layer on the substrate having the semiconductor layer;
   forming a first pattern on the gate insulating layer to expose the edge portion of the semiconductor layer;
   performing a first impurity implantation process on the edge portion of the semiconductor layer using the first pattern as a mask to form an edge region;
   removing the first pattern and placing a gate electrode on the gate insulating layer;
   forming a second pattern on the substrate to cover at least the edge region;
   performing a second impurity implantation process on the semiconductor layer using the second pattern as a mask to form source and drain regions on respective sides of a channel region in the semiconductor layer;

removing the second pattern and placing an interlayer insulating layer on the substrate having the gate electrode;

etching the gate insulating layer and the interlayer insulating layer to form a contact hole exposing a portion of the source region and a portion of the edge region; and placing a conductive layer on the substrate and then patterning the conductive layer to form an interconnection portion that connects the exposed portion of the edge region and the exposed portion of the source region.

2. The method according to claim 1, wherein impurities used in the first impurity implantation process have a conductivity type opposite to a conductivity type of impurities doped into the channel region.

3. The method according to claim 1, wherein impurities used in the second impurity implantation process have a conductivity type opposite to a conductivity type of impurities used in the first impurity implantation process.

4. A method of fabricating a thin film transistor (TFT), comprising:

placing a first semiconductor layer having a first source region, a first drain region, a first channel region, and an edge region and a second semiconductor layer having a second source region, a second drain region, a second channel region, and LDD regions on a substrate;

placing a gate insulating layer on the substrate having the first and second semiconductor layers;

forming a first pattern on the gate insulating layer to expose the edge region of the first semiconductor layer and the second source and drain regions of the second semiconductor layer;

performing a first impurity implantation process on the edge region of the first semiconductor layer and the second source and drain regions of the second semiconductor layer using the first pattern as a mask;

removing the first pattern and forming a first gate electrode and a second gate electrode on the first and second semiconductor layers, respectively;

performing an LDD implantation process on the LDD regions of the second semiconductor layer using the second gate electrode as a mask;

forming a second pattern on the substrate to cover at least the edge region of the first semiconductor layer and the second semiconductor layer;

performing a second impurity implantation process on the first source and drain regions of the first semiconductor layer using the second pattern as a mask;

placing an interlayer insulating layer on the substrate having the first and second gate electrodes;

forming a contact hole to expose a portion of the first source region of the first semiconductor layer and a portion of the edge region of the first semiconductor layer; and placing a conductive layer on the substrate and then patterning the conductive layer to form an interconnection portion that electrically connects the exposed portion of the edge region of the first semiconductor layer and the exposed portion of the first source region of the first semiconductor layer.

5. The method according to claim 4, wherein impurities used in the first impurity implantation process have a conductivity type opposite to a conductivity type of impurities doped into the channel region.

6. The method according to claim 4, wherein impurities used in the second impurity implantation process have a conductivity type opposite to a conductivity type of impurities used in the first impurity implantation process.

* * * * *